US011450531B2

(12) United States Patent
Kwon et al.

(10) Patent No.: US 11,450,531 B2
(45) Date of Patent: Sep. 20, 2022

(54) ATOMIC LAYER ETCHING METHOD

(71) Applicant: WONIK IPS CO., LTD., Pyeongtaek-si (KR)

(72) Inventors: Jun Hyuck Kwon, Osan-si (KR); Jin Sung Chun, Seongnam-si (KR); Sang Jun Park, Yongin-si (KR); Byung Chul Cho, Hwaseong-si (KR); Kwang Seon Jin, Osan-si (KR)

(73) Assignee: WONIK IPS CO., LTD., Pyeongtaek-si (KR)

( * ) Notice: Subject to any disclaimer, the term of this patent is extended or adjusted under 35 U.S.C. 154(b) by 0 days.

(21) Appl. No.: 17/125,345

(22) Filed: Dec. 17, 2020

(65) Prior Publication Data
US 2021/0193473 A1  Jun. 24, 2021

(30) Foreign Application Priority Data
Dec. 20, 2019  (KR) .................. 10-2019-0171653

(51) Int. Cl.
*H01J 37/32* (2006.01)
*H01L 21/3065* (2006.01)

(52) U.S. Cl.
CPC ........ *H01L 21/3065* (2013.01); *H01J 37/321* (2013.01); *H01J 37/32091* (2013.01)

(58) Field of Classification Search
CPC .............. H01J 37/32091; H01J 37/321; H01J 37/32357; H01L 21/3065; H01L 21/31122; H01L 21/31116
(Continued)

(56) References Cited

U.S. PATENT DOCUMENTS

| 2017/0243755 | A1* | 8/2017 | Tapily | ............... H01L 21/31116 |
| 2018/0144970 | A1* | 5/2018 | Chuang | ............ H01L 21/67069 |
| 2018/0366343 | A9* | 12/2018 | Fischer | ............. H01L 21/32136 |

FOREIGN PATENT DOCUMENTS

| TW | 201738952 A | 11/2017 |
| TW | 201835680 A | 10/2018 |

* cited by examiner

*Primary Examiner* — Lan Vinh
(74) *Attorney, Agent, or Firm* — William Park & Associates Ltd.

(57) ABSTRACT

The present invention relates to an atomic layer etching method for etching a surface of a substrate by using an atomic layer etching apparatus.
The present invention provides an atomic layer etching method by using an atomic layer etching apparatus including a process chamber having a sealed process space, a gas injection unit installed at an upper side in the process chamber to inject a gas into the process space, a substrate support installed at a lower side in the process chamber and on which a substrate is seated, and a remote plasma generation device, the atomic layer etching method including: a substrate preparing process (S10) of preparing a substrate (100) on the substrate support; a modification process (S20) of modifying a surface layer (110) of the substrate (100) by radicalizing a modification gas containing a halogen gas except hydrogen fluoride (HF) through the remote plasma generation device coupled to the process chamber and supplying the radicalized modification gas onto the substrate (100) after the substrate preparing process (S10); a first purge process (S30) of purging the surface layer; a surface layer removal process (S40) of removing the surface layer (110) modified in the modification process (S20) by supplying a metal-containing precursor to the surface layer (110); and a second purge process (S50) of purging a surface of the substrate (100).

17 Claims, 3 Drawing Sheets

(58) Field of Classification Search
USPC ......... 438/706, 710.711, 712, 714, 716, 717, 438/729, 720
See application file for complete search history.

ATOMIC LAYER ETCHING METHOD

CROSS-REFERENCE TO RELATED APPLICATIONS

This U.S. non-provisional patent application claims priority under 35 U.S.C. § 119 of Korean Patent Application No. 10-2019-0171653, filed on Dec. 20, 2019, the entire contents of which are hereby incorporated by reference.

FIELD OF THE INVENTION

The present invention disclosed herein relates to an atomic layer etching method for etching a surface of a substrate by using an atomic layer etching apparatus.

BACKGROUND ART

A semiconductor device such as DRAM, NAND flash memory, CPU, and mobile CPU and a display panel such as LCD panel and OLED panel are manufactured through at least one semiconductor process.

FIG. 1 is a conceptual view showing a typical atomic layer etching method. The typical atomic layer etching method is implemented through a modification process of modifying a surface layer 110 by applying hydrogen fluoride (HF) to a surface of a substrate 100 and a removal process of removing the surface layer 110 through reaction with the modified surface layer 110.

Here, the typical atomic layer etching method generally uses the hydrogen fluoride that easily modifies the surface layer by a strong reactivity thereof.

However, when the typical atomic layer etching method is performed in a state in which the substrate 100 is heated at a high temperature in the modification process and the removal process, the typical atomic layer etching method has a limitation in that a thermal impact may be applied to a semiconductor structure formed on the substrate 100 to act as a cause of a manufacturing defect of the substrate.

Although the hydrogen fluoride (HF) used in the typical atomic layer etching method has an advantage in strong reactivity, the hydrogen fluoride (HF) has an anisotropic property, which further reacts with an upward exposed portion, more than an uniform reaction (isotropic property), which reacts over an entire surface exposed to the hydrogen fluoride (HF). Thus, the hydrogen fluoride (HF) is not appropriate to an isotropic process condition.

When another halogen group material is used instead of the hydrogen fluoride, the substrate is necessarily heated at a high temperature to increase reactivity because the halogen group material has reactivity less than that of the hydrogen fluoride. Here, a thermal impact may be applied to a device structure formed on the substrate when the substrate is heated to damage the device structure or degrade a performance thereof. (Patent document 1) KR101080604 B1

SUMMARY OF THE INVENTION

The present invention provides an atomic layer etching method capable of performing an isotropic etching by processing a substrate by using a modification gas obtained by radicalizing a halogen gas except for hydrogen fluoride.

In accordance with an embodiment of the present invention, an atomic layer etching method by using an atomic layer etching apparatus including: a process chamber having a sealed process space; a gas injection unit installed at an upper side in the process chamber to inject a gas into the process space; a substrate support installed at a lower side in the process chamber and on which a substrate is seated, and a remote plasma generation device includes: a substrate preparing process S10 of preparing a substrate 100 on the substrate support; a modification process S20 of modifying a surface layer 110 of the substrate 100 by radicalizing a modification gas containing a halogen gas except hydrogen fluoride (HF) through the remote plasma generation device coupled to the process chamber and supplying the radicalized modification gas onto the substrate 100 after the substrate preparing process S10; a first purge process S30 of purging the surface layer; a surface layer removal process S40 of removing the surface layer 110 modified in the modification process S20 by supplying a metal-containing precursor to the surface layer 110; and a second purge process S50 of purging a surface of the substrate 100.

In an embodiment, the remote plasma generation device may radicalize the modification gas by using one of a capacitor coupled plasma (CCP) method, an inductively coupled plasma (ICP) method, and a micro waver method.

In an embodiment, the modification process S20 and the surface layer removal process S40 may form one cycle, and the one cycle may be repeated several times.

In an embodiment, a process pressure of the modification process S20 may be equal to or less than that of the surface layer removal process S40.

In an embodiment, a distance (H) between the substrate support and the substrate in the modification process S20 may be equal to or lesser than that in the surface layer removal process S40.

In an embodiment, the atomic layer etching method may be performed at a temperature of about 400° C. or less.

In an embodiment, the atomic layer etching method may further include a post-processing process S60 of post-processing the surface of the substrate 100 by supplying a post-processing gas to remove a halogen compound remained on the surface of the substrate 100 after the surface layer removal process S40.

In an embodiment, the post-processing process S60 may be performed by using a gas containing hydrogen or oxygen.

In an embodiment, the post-processing process S60 may be performed by a plasma method or a heating method.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE PREFERRED EMBODIMENTS

Hereinafter, an atomic layer etching method in accordance with the present invention will be described with reference to the accompanying drawings.

Figure 1:
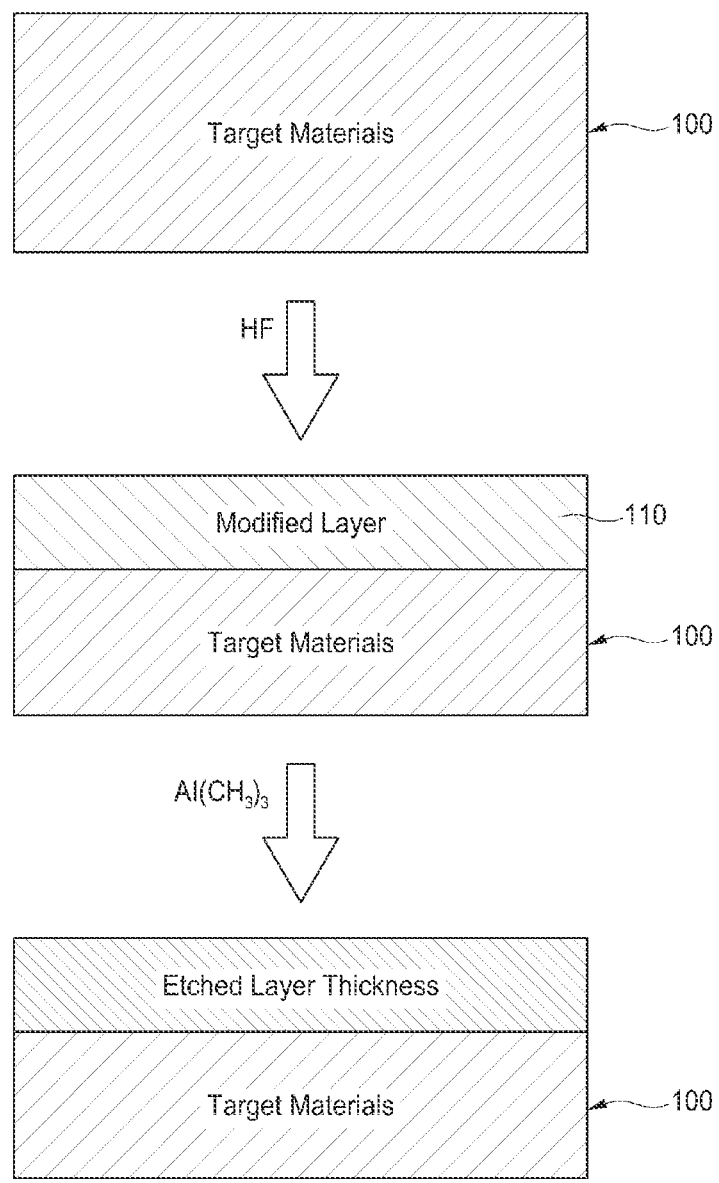
FIG. 1 is a conceptual view showing a typical atomic etching method.
Figure 2:
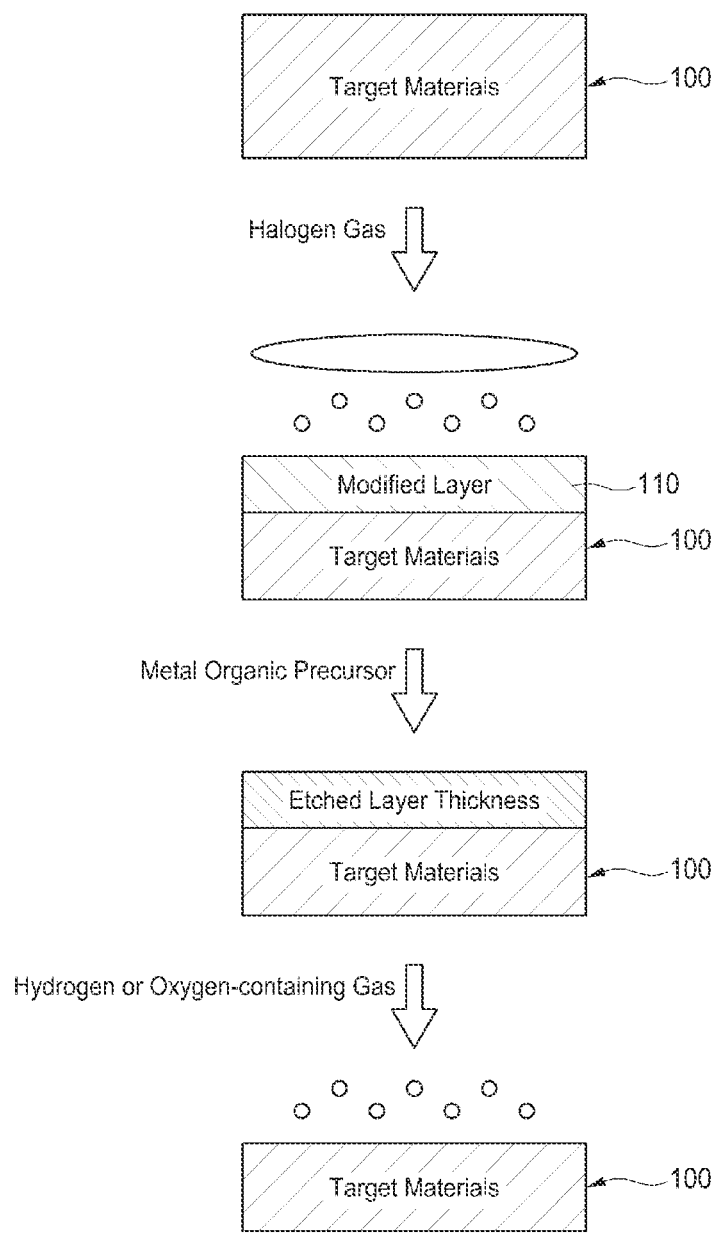
FIG. 2 is a conceptual view showing an atomic layer etching method in accordance with the present invention.
Figure 3:
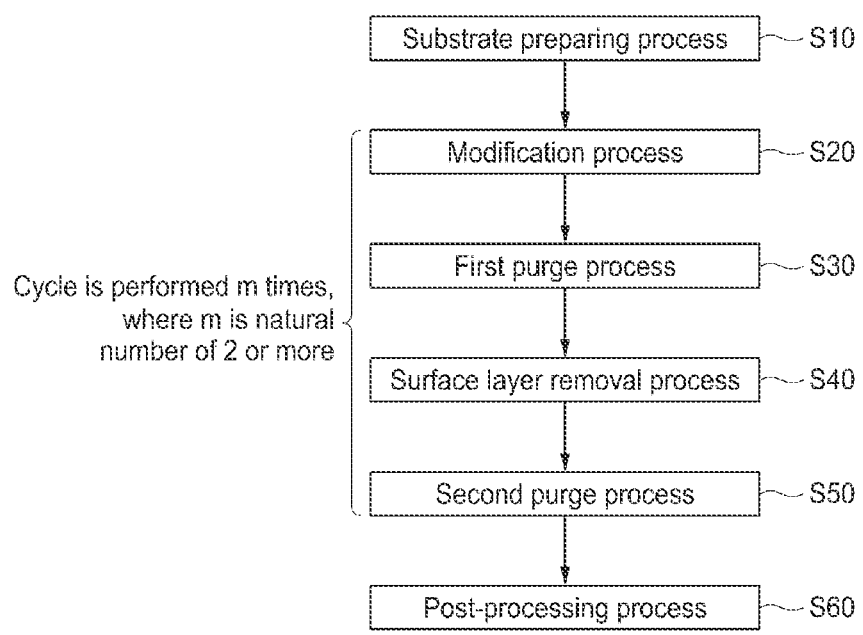
FIG. 3 is a flowchart showing one example of the atomic layer etching method in accordance with the present invention.

As illustrated in FIGS. 2 and 3, the atomic layer etching method in accordance with the present invention uses an atomic layer etching apparatus including: a process chamber having a sealed process space; a gas injection unit installed at an upper side in the process chamber to inject a gas into the process space; a substrate support installed at a lower side in the process chamber and on which a substrate is seated; and a remote plasma generation device. The atomic layer etching method includes: a substrate preparing process S10 of preparing a substrate 100 on the substrate support; a modification process S20 of modifying a surface layer 110 of the substrate 100 by radicalizing a modification gas containing a halogen gas except the hydrogen fluoride (HF) through the remote plasma generation device coupled to the process chamber and supplying the radicalized modification gas onto the substrate 100 after the substrate preparing process S10; a first purge process S30 of purging the surface layer; a surface layer removal process S40 of removing the surface layer 110 modified in the modification process S20 by supplying a metal-containing precursor to the surface layer 110; and a second purge process S50 of purging a surface of the substrate 100.

First, the substrate 100 on which the atomic layer etching method in accordance with the present invention is performed may include all sorts of substrates having a manufacturing process including an etching process. For example, the substrate 100 may include various substrates such as a substrate for manufacturing a semiconductor device such as DRAM, NAND flash memory, CPU, and mobile CPU and a display panel such as LCD panel and OLED panel.

Also, a material of a layer to be etched of the substrate 100 may be $Al_2O_3$, $HfO_2$, or $ZrO_2$, preferably $Al_2O_3$. For reference, the substrate is expressed by "Target materials" to emphasize the property of the object to be etched in FIG. 2.

Also, the atomic layer etching method in accordance with the present invention is performed by the atomic layer etching apparatus.

The atomic layer etching apparatus performs an etching process, instead of a deposition process, in a method similar to an atomic layer deposition method.

For example, like the patent document 1, the atomic layer etching apparatus may include: a process chamber having a sealed process space; a gas injection unit installed at an upper side in the process chamber to inject a gas into the process space; a substrate support installed at a lower side in the process chamber and on which a substrate is seated; and a remote plasma generation device.

As a component for providing the sealed process space for performing an etching process, the process chamber may have various constitutions including a chamber main body having an opened upper side and a lid coupled to the chamber main body in a detachable manner.

As a component installed at the upper side in the process chamber to inject a gas into the process space, the gas injection unit may have various constitutions including the substrate support or the like.

As a component installed at the lower side in the process chamber and on which the substrate is seated, the substrate support may have various constitutions. Here, the substrate support may include: a lift pin assembly for vertical movement of the substrate with respect to a top surface of the substrate support; a heater for heating the substrate seated on the substrate support; and an electrostatic chuck for adsorbing and fixing the substrate by using an electrostatic force.

Also, when a distance between the substrate support and the gas injection unit is required to be changed for replacing a substrate or performing a process, the substrate support may be installed to vertically move.

The remote plasma generation device is coupled with the process chamber to transfer a gas with the gas injection unit, thereby radicalizing a modification gas, which will be described later, when the modification gas is supplied, and then injecting the modification gas through the gas injection unit.

Also, the remote plasma generation device may use, as a plasma generation method, a capacitor coupled plasma (CCP) method, an inductively coupled plasma (ICP) method, and a micro wave method.

As a process of preparing the substrate 100 on the substrate support, the substrate preparing process S10 may be performed by various methods according to a substrate transferring method and a substrate replacing method.

For example, the substrate preparing process S10 discharges the substrate 100, which has undergone a process, by an end-effector of a transfer robot (not shown) and then loads the substrate 100, on which a process will be performed, onto the substrate support.

Here, the lift-pin assembly may be installed on the substrate support to receive the substrate 100 from the end-effector of the transfer robot, and the substrate support may raise and lower the lift-pin assembly and the substrate 100 with respect to a top surface of the substrate support.

After the substrate preparing process S10, the modification process S20 radicalizes the modification gas containing the halogen gas except for the hydrogen fluoride (HF) through the remote plasma generation device coupled to the process chamber and supplies the radicalized modification gas onto the substrate 100 to modify the surface layer 110 of the substrate 100. The modification process S20 may be performed by various methods.

In FIG. 2, the surface layer 110 is expressed by a modified layer in consideration that the surface layer 110 is modified.

The modification gas, which contains a halogen gas except for hydrogen fluoride (HF), may include a gas containing $NF_3$, $F_2$, $CF_4$, HCl, HBr, $SF_6$, and $Cl_2$ except for HF.

Also, in the modification process S20, the remote plasma generation device may use the capacitor coupled plasma (CCP) method, the inductively coupled plasma (ICP) method, and the micro wave method to radicalize the modification gas.

Here, a property of the surface layer 110 of the substrate 100 is modified, by performing the modification process S20, into a property capable of being removed by performing the surface layer removal process S40 that is a follow-up process.

For example, when the property of the substrate 100 to be etched is $Al_2O_3$, and one of $NF_3$, $F_2$, and $CF_4$ is used as the modification gas, the property of the surface layer 110 is changed from $Al_2O_3$ to AlF after the modification process S20 is performed.

Here, the substrate 100 having the property of $Al_2O_3$ is required to be heated at a temperature of 500° C. or more so that the substrate 100 reacts with the modification gas. This may cause a thermal limitation to a device formed on the substrate 100.

Thus, when the surface layer 110 is modified by radicalizing the modification gas and injecting the radicalized modification gas to the substrate 100, the surface layer 110 of the substrate 100 may be modified at a low temperature.

The first purge process S30, as a process of purging the surface layer, may be performed by various methods.

For example, the first purge process S30 may performs purge by using an inert gas such as argon gas (Ar) to remove the residual modification gas on the surface of the substrate.

Here, the first purge process S30 may be continuously performed after the modification gas is injected by continuously injecting an inert gas such as argon gas (Ar) into the process chamber (not shown) even while the modification process S20 is performed.

As a process of removing the surface layer 110 modified in the modification process S20 by supplying the metal-containing precursor, the surface layer removal process S40 may be performed by various methods.

The metal-containing precursor, as a precursor removing the surface layer 110 modified after the modification process S20, may be varied according to the property of the modified surface layer 110.

For example, when the property of the layer to be etched of the substrate 100 is $Al_2O_3$, $HfO_2$, or $ZrO_2$, a precursor such as TMA, DMAI, or ACAC may be used as the metal-containing precursor.

As a specific example, in a state in which the property of the surface layer 110 is changed from $Al_2O_3$ to AlF after the modification process S20 is performed, the AlF may be removed by a metal organic precursor such as TMA, DMAI, or ACAC in the surface layer removal process S40.

In FIG. 2, the modified layer is expressed by "etched layer thickness" to represent a layer removed by the metal-containing precursor.

The second purge process 50, as a process of purging the surface of the substrate 100, may be performed by various methods.

Here, like the first purge process S30, the second purge process S50 may be continuously performed after the modification gas is injected by continuously injecting an inert gas such as argon gas (Ar) into the process chamber (not shown) even while the modification process S20 and the surface layer removal process S40 are performed.

Also, the modification process S20 and the surface layer removal process S40 may form one cycle and be repeatedly performed several times according to a thickness of the surface layer 110 to be removed.

That is, the one cycle of the modification process S20 and the surface layer removal process S40 may be repeated several times to etch the substrate 100 to a desired thickness.

Also, the modified surface layer 110 may be partially remained on the top surface of the substrate 100 after the surface layer removal process S40 is performed instead of being completely removed.

That is, after the surface layer removal process S40 is performed, the modification material remaining on the top surface of the substrate 100 is necessarily removed.

Thus, the atomic layer etching method in accordance with the present invention may further include a post-processing process S60 that post-processes the surface of the substrate 100 by supplying a post-processing gas to remove a halogen compound remained on the surface of the substrate 100 after the surface layer removal process S40.

As a process of removing the halogen compound remained on the surface of the substrate 100 after the surface layer removal process S40, the post-processing process S60 may be performed by various methods.

A gas containing hydrogen (H) or oxygen (O) may be used as the post-processing gas in consideration that a property to be removed is the halogen compound.

More specifically, the post-processing gas may include a hydrogen (H) containing gas such as $H_2O$, $H_2O_2$, $NH_3$, and $H_2$ and an oxygen (O) containing gas such as $H_2O$, $H_2O_2$, $O_2$, and $O_3$.

In case of $H_2O$, $H_2O_2$, and $O_3$, the residual halogen compound may be removed by only heating the substrate. However, in case of $NH_3$, $H_2$ and $O_2$, $NH_3$, $H_2$, and $O_2$ may be radicalized by using plasma because of low reactivity thereof to remove the residual halogen compound.

That is, the post-processing process S60 may be performed by applying the post-process gas to the plasma.

Here, the post-process gas may be radicalized by using a remote plasma generation device.

Here, the remote plasma generation device for radicalizing the above-described modification gas may be used as the remote plasma generation device for radicalizing the post-processing gas.

Also, the remote plasma generation device may use, as a plasma generation method, a capacitor coupled plasma (CCP) method, an inductively coupled plasma (ICP) method, and a micro waver method.

When the atomic layer etching method in accordance with the present invention include the post-processing process S60, the modification process S20 to the post-processing process S60 may form one cycle and be repeatedly performed several times.

For another example, the atomic layer etching method in accordance with the present invention may perform the post-processing process S60 as a final process after one cycle of the modification process S20 to the surface layer removal process S40 are repeatedly performed several times.

As described above, the atomic layer etching method in accordance with the present invention including the modification process S20 to the surface layer removal process S40 or the modification process S20 to the post-processing process S60 may be performed by various process conditions. Also, the atomic layer etching method in accordance with the present invention may be continuously performed in one process chamber, or each of the processes or only the surface layer removal process S40 may be performed in a separate process chamber.

For example, the atomic layer etching method in accordance with the present invention may be performed in a process chamber including a susceptor on which the substrate 100 is seated and a substrate support installed at an upper portion of the susceptor while varying the process condition for each process.

Here, the atomic layer etching method may be performed under a condition in which a process pressure of the modification process S20 is equal to or less than that of the surface layer removal process S40.

When the atomic layer etching method is performed under the condition in which the process pressure of the modification process S20 is equal to or less than that of the surface layer removal process S40, a mean free path of the modification gas and a life time of the radical may increase, and thus the modification gas may be supplied to even a pattern having a greater aspect ratio (AR).

When the process pressure is great in the modification process S20, the modified surface layer 10 may be formed with a relatively great thickness. Thus, the modification process S20 may be preferably performed at a relatively low process pressure.

However, the surface layer removal process S40 may be preferably performed at a relatively high process pressure because the surface layer 110 is efficiently removed for a short time.

As a similar process condition, when the susceptor on which the substrate 100 is seated is installed to vertically move, a distance (H) between the substrate support and the substrate in the modification process S20 may be equal to or lesser than that in the surface layer removal process S40.

When the distance (H) between the substrate support and the substrate is small in the modification process S20, the modified surface layer 110 may be formed with a relatively great thickness. Thus, the modification process S20 may be preferably preformed with a relatively great process distance (H).

However, the surface layer removal process S40 may be preferably performed with a relatively small process distance (H) because the surface layer 110 is efficiently removed for a short time.

Furthermore, when the distance in the modification process S20 increases by adjusting the distance between the substrate support and the substrate, a surface density of the substrate 100 may relatively decrease. As a result, the mean free path of the modification gas may increase and be supplied to even a pattern having a great aspect ratio (AR).

Also, since the atomic layer etching method in accordance with the present invention has a characteristic in minimizing the thermal impact with respect to the substrate 100 when the surface etching is performed, the atomic layer etching method in accordance with the present invention may be preferably performed at a temperature condition of about 400° C. or less.

The atomic layer etching method in accordance with the present invention has an advantage in that the isotropic etching is performed at the relatively low temperature condition, and the environmentally stable substrate processing is performed by modifying the surface layer using the modification gas obtained by radicalizing the halogen gas except for the hydrogen fluoride and removing the modified surface layer.

Furthermore, the atomic layer etching method in accordance with the present invention may perform the processes at the relatively low temperature condition to minimize the thermal impact with respect to the substrate, thereby minimizing the performance degradation or damage of the semiconductor device caused by the thermal impact by modifying the surface layer using the modification gas obtained by radicalizing the halogen gas except for the hydrogen fluoride and removing the modified surface layer.

Although the above description merely corresponds to some exemplary embodiments that may be implemented by the present invention, as well known, the scope of the present invention should not be interpreted as being limited to the above-described embodiments, and all technical spirits having the same basis as that of the above-described technical spirit of the present invention are included in the scope of the present invention.

What is claimed is:

1. An atomic layer etching method by using an atomic layer etching apparatus comprising:
    a process chamber having a sealed process space;
    a gas injection unit installed at an upper side in the process chamber to inject a gas into the process space;
    a substrate support installed at a lower side in the process chamber and on which a substrate is seated; and
    a remote plasma generation device,
the atomic layer etching method comprising:
    a substrate preparing process of preparing a substrate on the substrate support;
    a modification process of modifying a surface layer of the substrate by radicalizing a modification gas containing a halogen gas except hydrogen fluoride (HF) through the remote plasma generation device coupled to the process chamber and supplying the radicalized modification gas onto the substrate after the substrate preparing process;
    a first purge process of purging the surface layer;
    a surface layer removal process of removing the surface layer modified in the modification process by supplying a metal-containing precursor to the surface layer; and
    a second purge process of purging a surface of the substrate,
wherein the modification process, the first purge process, the surface layer removal process and the second purge process are continuously performed in the process chamber,
wherein the modification process, the first purge process, the surface layer removal process and the second purge process form one cycle, and the one cycle is repeated a predetermined number of times, and
wherein the substrate support are installed to vertically move in order to change a distance between the substrate support and the gas injection unit.

2. The atomic layer etching method of claim 1, wherein the remote plasma generation device radicalizes the modification gas by using one of a capacitor coupled plasma (CCP) method, an inductively coupled plasma (ICP) method, and a micro waver method.

3. The atomic layer etching method of claim 1, wherein the modification process and the surface layer removal process form one cycle, and the one cycle is repeated several times.

4. The atomic layer etching method of claim 1, wherein a process pressure of the modification process is equal to or less than that of the surface layer removal process.

5. The atomic layer etching method of claim 2, wherein a process pressure of the modification process is equal to or less than that of the surface layer removal process.

6. The atomic layer etching method of claim 3, wherein a process pressure of the modification process is equal to or less than that of the surface layer removal process.

7. The atomic layer etching method of claim 1, wherein a distance between the substrate support and the substrate in the modification process is equal to or lesser than that in the surface layer removal process.

8. The atomic layer etching method of claim 2, wherein a distance between the substrate support and the substrate in the modification process is equal to or lesser than that in the surface layer removal process.

9. The atomic layer etching method of claim 3, wherein a distance between the substrate support and the substrate in the modification process is equal to or lesser than that in the surface layer removal process.

10. The atomic layer etching method of claim 1, wherein the atomic layer etching method is performed at a temperature of about 400° C. or less.

11. The atomic layer etching method of claim 2, wherein the atomic layer etching method is performed at a temperature of about 400° C. or less.

12. The atomic layer etching method of claim 3, wherein the atomic layer etching method is performed at a temperature of about 400° C. or less.

13. The atomic layer etching method of claim 1, further comprising a post-processing process of post-processing the surface of the substrate by supplying a post-processing gas to remove a halogen compound remained on the surface of the substrate after the surface layer removal process.

14. The atomic layer etching method of claim 2, further comprising a post-processing process of post-processing the surface of the substrate by supplying a post-processing gas to remove a halogen compound remained on the surface of the substrate after the surface layer removal process.

15. The atomic layer etching method of claim 3, further comprising a post-processing process of post-processing the surface of the substrate by supplying a post-processing gas to remove a halogen compound remained on the surface of the substrate after the surface layer removal process.

16. The atomic layer etching method of claim 13, wherein the post-processing process is performed by using a gas containing hydrogen or oxygen.

17. The atomic layer etching method of claim 16, wherein the post-processing process is performed by a plasma method or a heating method.

\* \* \* \* \*